United States Patent
Levasier et al.

(10) Patent No.: US 6,995,831 B2
(45) Date of Patent: Feb. 7, 2006

(54) LITHOGRAPHIC APPARATUS WITH ALIGNMENT SUBSYSTEM, DEVICE MANUFACTURING METHOD, USING ALIGNMENT, AND ALIGNMENT STRUCTURE

(75) Inventors: Leon Martin Levasier, Hedel (NL); Arie Jeffrey Den Boef, Waalre (NL); Ingo Dirnstorfer, Eindhoven (NL); Andre Bernardus Jeunink, Bergeyk (NL); Stefan Geerte Kruijswijk, Eindhoven (NL); Henricus Petrus Maria Pellemans, Veldhoven (NL); Irwan Dani Setija, Utrecht (NL); Hoite Pieter Theodoor Tolsma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/068,895

(22) Filed: Mar. 2, 2005

(65) Prior Publication Data
US 2005/0146699 A1 Jul. 7, 2005

Related U.S. Application Data

(62) Division of application No. 10/736,230, filed on Dec. 16, 2003.

(30) Foreign Application Priority Data

Dec. 16, 2002 (EP) .................................. 02080334
Feb. 14, 2003 (EP) .................................. 03075432
Apr. 4, 2003 (EP) .................................. 03076010

(51) Int. Cl.
*G03B 27/42* (2006.01)
*G03F 1/00* (2006.01)
*G03F 9/00* (2006.01)

(52) U.S. Cl. ............................... 355/53; 430/5; 430/22
(58) Field of Classification Search ................... 355/52, 355/53, 55, 67; 430/5, 20, 30; 356/399–401; 250/548
See application file for complete search history.

(56) References Cited

U.S. PATENT DOCUMENTS

| 5,026,166 A | 6/1991 | van der Werf |
| 5,477,057 A | 12/1995 | Angeley et al. |
| 5,754,300 A | 5/1998 | Magome et al. |
| 6,011,611 A * | 1/2000 | Nomura et al. ............... 355/67 |

(Continued)

FOREIGN PATENT DOCUMENTS

EP 0 477 026 B1 4/1995

(Continued)

OTHER PUBLICATIONS

European Search Report dated Oct. 22, 2003 in reference to European Application No. 02 08 0334.

(Continued)

*Primary Examiner*—Henry Hung Nguyen
(74) *Attorney, Agent, or Firm*—Pillsbury Winthrop Shaw Pittman LLP

(57) ABSTRACT

A lithographic apparatus according to one embodiment of the invention includes an alignment subsystem configured to align the substrate on the substrate table relative to the patterning structure. The alignment structure comprises a non-periodic feature which may be detectable as e.g. a capture position or a check position using a reference grating in the alignment subsystem. The non-periodic feature may cause a phase effect in the detected signal of the alignment subsystem or an amplitude effect.

8 Claims, 8 Drawing Sheets

U.S. PATENT DOCUMENTS

| | | | |
|---|---|---|---|
| 6,356,343 B1 * | 3/2002 | Shiraishi et al. | 355/77 |
| 6,388,341 B2 * | 5/2002 | Arai et al. | 257/797 |
| 6,778,275 B2 * | 8/2004 | Bowes | 356/400 |
| 6,781,694 B2 * | 8/2004 | Nahum et al. | 356/420 |
| 6,809,827 B2 * | 10/2004 | Kreuzer | 356/508 |

FOREIGN PATENT DOCUMENTS

| | | |
|---|---|---|
| EP | 1 148 390 A2 | 10/2001 |
| EP | 1 278 104 A1 | 1/2003 |
| JP | 5-217835 | 8/1993 |

OTHER PUBLICATIONS

European Search Reported dated Feb. 5, 2004 in reference to European Application No. 03 07 6010.

European Search Report dated Jan. 28, 2004 in reference to European Application No. 03 07 5432.

* cited by examiner

LITHOGRAPHIC APPARATUS WITH ALIGNMENT SUBSYSTEM, DEVICE MANUFACTURING METHOD, USING ALIGNMENT, AND ALIGNMENT STRUCTURE

RELATED APPLICATIONS

This application claims benefit of and is a divisional application of U.S. patent application Ser. No. 10/736,230, filed Dec. 16, 2003, which claims priority from European Patent Application EP 02080334.2, filed Dec. 16, 2002; European Patent Application EP 03075432.9, filed Feb. 14, 2003; and European Patent Application EP 03076010.2, filed Apr. 4, 2003, all of these documents being incorporated herein by reference.

FIELD OF THE INVENTION

The present invention relates to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and U.S. Pat. No. 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, and catadioptric systems, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis. devices, etc. The skilled artisan will appreciate that, in the context of such alternative applications, any use of the terms "wafer" or "die" in this text should be considered as being replaced by the more general terms "substrate" and "target portion", respectively.

A phase grating alignment technique may have the problem that it only works when sufficiently large alignment structures and/or reference structures can be used such that the substrate can be initially positioned to image the alignment structure onto the reference structure. In other words, such a technique may require the capture range of the phase grating alignment to be sufficiently large. Large alignment structures and/or reference structures are expensive, e.g. because they occupy space on the substrate which could otherwise contain circuit components. Therefore, it may be desirable to reduce the area of the alignment structures and/or the reference structures.

SUMMARY

A device manufacturing method according to an embodiment of the invention includes using a patterning structure to pattern a beam of radiation according to a desired pattern and aligning a substrate, including an alignment structure having spatially varying optical properties, relative to the patterning structure. In this method, aligning a substrate includes processing light affected by the alignment structure to produce measurement light of which the intensity varies with the relative position of (1) the spatially periodic alignment structure and (2) a reference position relating to the patterning structure. Aligning a substrate also includes measuring at least one of intensity information and phase information of the measurement light and controlling a relative position of the substrate and the patterning structure based on the measured information, and detecting a position of a non-periodic feature of the alignment structure.

An alignment structure according to an embodiment of the invention includes at least one phase grating mark having a plurality of adjacent lines and spaces with a predetermined periodicity. The alignment structure comprises a non-periodic feature located between two parts of the alignment structure that have predetermined periodicities along a line. Substrates and lithographic apparatus according to embodiments of the invention are also disclosed herein.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, methods and apparatus that may be used to provide for alignment of a substrate and a patterning structure in which a capture range or a robustness of a periodic alignment system is improved.

Figure 1:
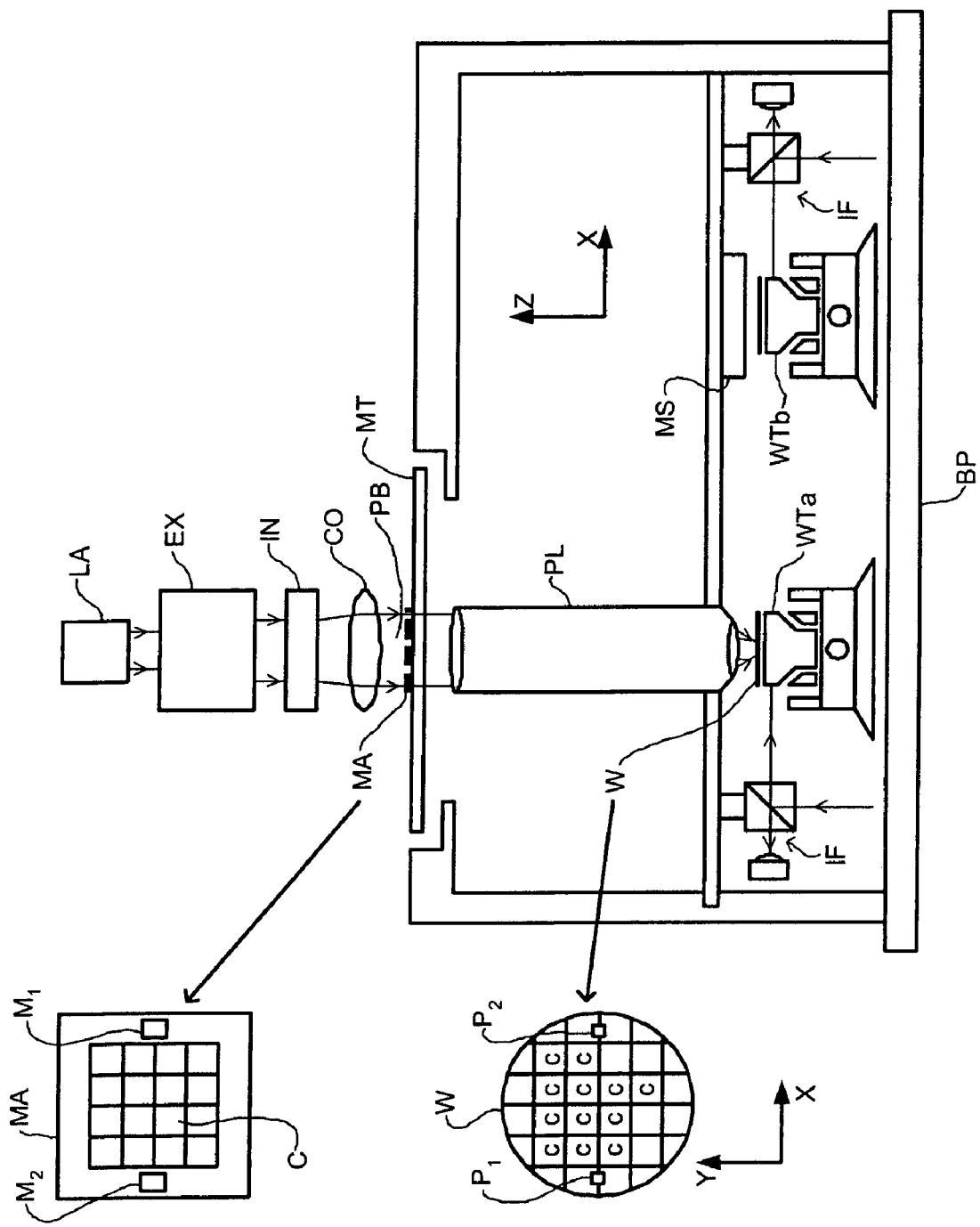
FIG. 1 depicts a lithographic apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation. In this particular example, the radiation system Ex, IL, for supplying a projection beam PB of radiation (e.g. UV or EUV radiation) also comprises a radiation source LA;

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source LA (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above-described modes of use or entirely different modes of use may also be employed.

The term "optics" as used herein and in the claims appended hereto indicates one or more optics and/or optical elements, such being any object capable of processing light in any known manner, such as reflection, refraction, transmission, diffraction, deflection, detection, and/or interference.

Before a pattern is projected onto a substrate, it may be desirable to accurately position the substrate relative to a patterning structure, so that the pattern will be projected onto the substrate accurately at a required position. In modern semiconductor manufacturing, for example, it may be desirable or even necessary to realize such positioning with nanometer accuracy.

European patent application EP-A-1148390 describes such alignment, using a phase grating alignment system. Such a system uses a substrate that includes an alignment structure having periodically variable optical properties. The phase grating alignment system measures the phase of the period of the alignment structure relative to some reference position that is defined (directly or indirectly) relative to the patterning structure. From the phase, a measurement of the position of the substrate is obtained.

The phase measurement may be realized by incorporating the alignment structure in an optical interference arrangement that outputs light with an intensity that depends on the phase. The interference arrangement may contain, for example, an imaging element that selects light diffracted by the alignment structure in a selected order of diffraction and images the selected light onto a reference structure in the lithographic apparatus. This reference structure may have spatially periodically variable optical properties, with a period that corresponds to the period of the image of the alignment structure. As a result, the light output through the reference structure forms a kind of Moire pattern. This pattern varies as the image of the alignment structure moves relative to the reference structure, dependent on the extent to which the image of the least reflective parts of the periods of the alignment structure coincide with the least transmissive parts of the periods of the reference structure. As a result, the spatially averaged intensity of the output light varies periodically as a function of the position of the substrate.

A similar periodic variation can also be realized without a reference structure. European patent application No. EP 1148390 describes how interference may be used between light from the alignment structure that reaches a detector along two paths which correspond to images of the alignment structure that have been rotated 180 degrees with respect to one another. In this case, the centre of that rotation serves to provide a defined position relative to the lithographic apparatus, and the detected light intensity varies periodically as a function of the position of the substrate relative to the defined position.

In such interference arrangements, the periodic variation of the averaged intensity can be measured without requiring a detector with high spatial resolution. The measurement of the intensity of the detected light makes it possible to assign phase values to different positions of the alignment structure. The phase values in turn may be used for accurate positioning of the substrate in the direction of periodical variation of the optical properties of the alignment structure.

Using a phase grating alignment subsystem allows a high alignment accuracy to be realized. Selection of an individual order of diffraction considerably reduces noise, since only light which has the spatial frequency of the alignment structure is detected. Compared to alignment techniques that use electronic pattern recognition of images of semiconductor wafers, phase grating filtering techniques may realize accurate and low-noise alignment with detection and control circuits that are less critical for the alignment.

A phase grating alignment technique may have the problem that it only works when sufficiently large alignment structures and/or reference structures can be used such that the substrate can be initially positioned to image the alignment structure onto the reference structure. In other words, such a technique may require the capture range of the phase grating alignment to be sufficiently large. Large alignment structures and/or reference structures are expensive, e.g. because they occupy space on the substrate which could otherwise contain circuit components. Therefore, it is desirable to reduce the area-of the alignment structures and/or the reference structures. However, it has been found that when an alignment structure is less than a given size, while the structure may still be suitable for accurate positioning purposes, it may not always work immediately because the image of the alignment structure has no overlap with the reference structure when the substrate is initially positioned (i.e. insufficient capture range).

Also, the periodic alignment structure in combination with the interference arrangement will provide an output signal with a certain periodicity in it. E.g., when using a 8.0 $\mu$m phase grating as alignment structure and reference grating, the position can be accurately positioned, but only within 8.0 $\mu$m. When using a Nonius-principle measurement with an alignment structure having two different phase gratings of 8.0 and 8.8 $\mu$m, a periodicity of 88 $\mu$m exists. With the existing (fine) alignment methods, therefore, there is a chance that an error is made of one or more periods of the periodic signal. Here, periodicity is defined as the dimension of a single period of a periodic signal.

Figure 2:
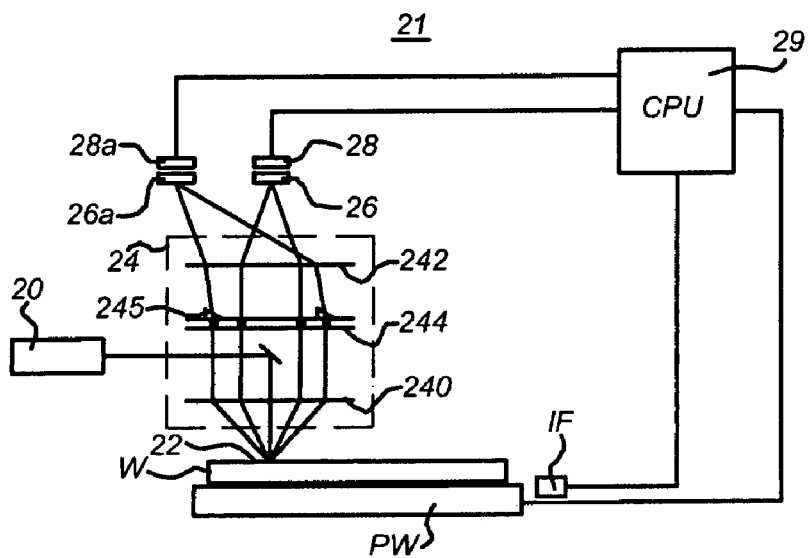
FIG. 2 depicts an alignment subsystem of the lithographic apparatus of FIG. 1.

An alignment subsystem may be included in a lithographic apparatus for accurately measuring the position of substrate W to ensure that substrate W is properly aligned during projection. FIG. 2 schematically shows an example 21 of an alignment subsystem that contains an optical subsystem with a radiation source 20, an imaging structure 24, reference structures 26, 26a (forming an optical interference arrangement), detectors 28, 28a and a processing unit 29. Although processing unit 29 is shown as one element, it will be understood that processing unit 29 may be made up of a number of interconnected processors. Radiation source 20 (for example, a laser) is arranged to generate a spot of light that is directed to an area 22 on substrate W. Imaging structure 24 contains a lens arrangement 240, 242 to image area 22 onto reference structure 26. In this example, reference structure 26 has spatially periodic transmissive properties. Detector 28 is arranged to detect a spatially averaged intensity of radiation transmitted by reference structure 26. Detector 28 has an output coupled to an input of processing unit 29, which in turn has a control output coupled to second positioning structure PW, which is coupled to substrate W.

Interferometric measuring structure IF has an output coupled to processing unit 29. It will be understood that various changes may be made to the alignment subsystem 21 without affecting its function. For example, mirrors may be added that may enable moving elements of the alignment subsystem to more convenient locations. In one embodiment, the alignment subsystem 21 is immediately next to the projection lens, but it will be understood that the alignment subsystem 21 may be further removed from the projection lens. It is not necessary that the substrate is in the path of the projection beam during alignment. In fact, another substrate (e.g. on a separate substrate table) may even be in the path of the projection beam during alignment.

In operation, radiation from radiation source 20 is reflected from area 22, and imaging structure 24 uses the reflected radiation to image area 22 onto reference structure 26. The imaged radiation is partially transmitted by reference structure 26 onto detector 28, which generates an electric or electronic signal that is indicative of the spatially averaged intensity of the transmitted radiation.

Processing unit 29 uses this electric or electronic signal to generate control signals for positioning structure PW. This operation involves a number of stages (which may be executed by different elements (not shown) of processing unit 29). In a pre-positioning stage, processing unit 29 moves substrate W and/or the alignment subsystem 21 relative to one another so that an alignment structure is imaged onto reference structure 26. In an accurate positioning stage, processing unit 29 accurately measures the position of substrate W and the alignment subsystem 21 relative to one another (i.e. it determines for which output value of interferometric measuring structure IF substrate W and alignment subsystem 21 are in a specific alignment relative to one another). Subsequently, processing unit 29 uses this measurement to control one or more positions with a predetermined offset to a position at which substrate W and the alignment subsystem 21 are in alignment, to which substrate is moved for illumination with projection beam PB.

For accurate alignment, substrate W contains an alignment structure 10 (see FIGS. 3, 5, 7, 9 and 10, to be discussed below) with spatially periodic reflection properties in area 22. During accurate alignment, this alignment structure 10 is imaged onto reference structure 26. The spatially averaged amount of light transmitted by reference structure 26 depends periodically on the relative phase of the image of the alignment structure 10 and reference structure 26.

Preferably, imaging structure 24 passes only selected pairs of orders of diffraction onto reference structure 26. As shown, imaging structure 24 has been designed to filter out selected orders of diffraction from area 22. For this purpose, imaging element contains lenses 240, 242 with a diffraction order filter 244 in between. A first lens 240 maps light diffracted in respective directions to respective positions on diffraction order filter 244, which transmits only light from selected positions. A second lens forms an image of area 22 from the transmitted light. Thus only selected pairs of orders of diffraction are used for imaging onto reference structure 26. Without such selective transmission, position measurement is in principle also possible, but it may have a worse signal-to-noise ratio.

It may be desired to treat separately a number of pairs of diffraction orders of the light from area 22. For this purpose, wedges 245 may be provided to ensure that different pairs of orders are imaged onto different reference structures 26, 26a, each provided with its own detector 28, 28a. Although only two reference structures 26, 26a and corresponding detectors 28, 28a have been shown (for pairs of diffraction orders +/−1 and +/−2, respectively), it should be understood that in practice a larger number of diffraction orders, for example seven pairs of diffraction orders +/−n (n=1, 2, 3, 4, 5, 6, 7, . . . ) may be treated separately, each with its own reference structure and detector.

In an actual embodiment of the above described alignment subsystem 21, the imaging structure 24 may be arranged to filter out the 0-th order, effectively halving the period (or doubling the frequency) of the alignment structure 10. A 16 $\mu$m period of the alignment structure 10 on the wafer W then effectively becomes a 8 $\mu$m period on the reference grating 26.

Although single elements 240, 242 have been shown for the sake of simplicity, it should be understood that in practice the imaging structure 24 may comprise a combination of lenses and/or imaging mirrors.

Furthermore, although a configuration has been shown wherein radiation is first reflected from substrate W and then transmitted through reference structure 26 before detection, it should be appreciated that other configurations may be used. For example, radiation reflected off reference structure 26 may be detected, and/or radiation transmitted through substrate W may be used if substrate W permits this. Similarly, radiation may be fed to reference structure 26 first (for reflection or transmission) before being fed to substrate W prior to detection. Also, of course, the invention is not limited to a perpendicular incidence as shown in FIG. 2.

Figure 3:
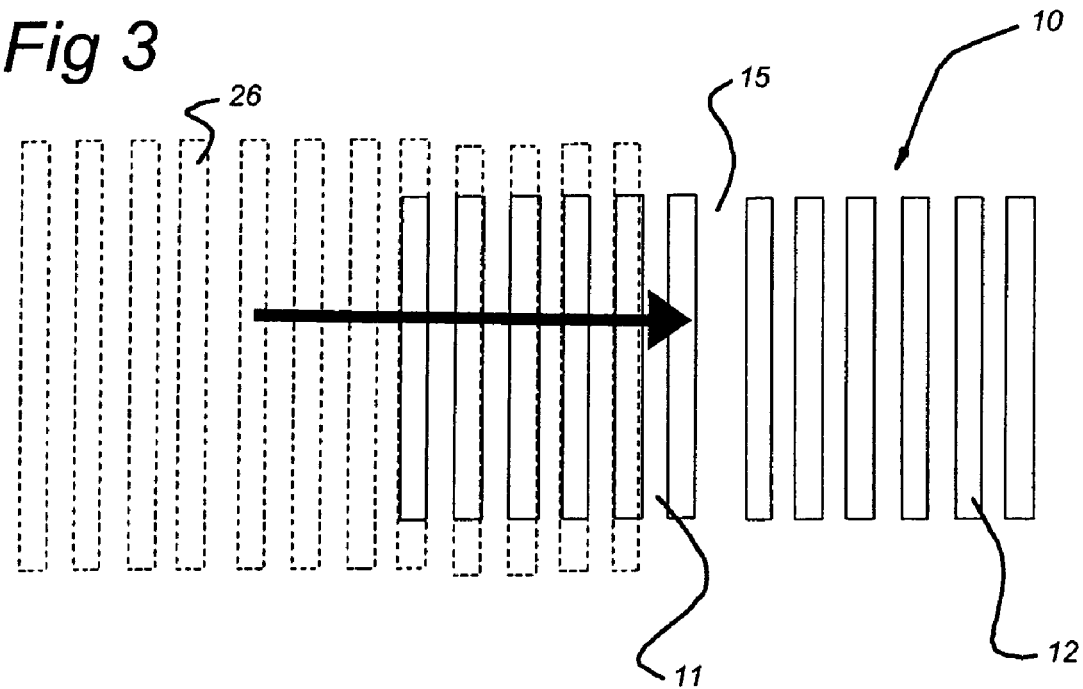
FIG. 3 depicts an alignment structure according to an embodiment of the present invention.

To allow accurate measurement of a wafer position (also called Fine Wafer Alignment or FIWA), the alignment structure or mark 10 in the area 22 on the wafer W, in accordance with the prior art, may comprise two different gratings for both the X- and Y-direction (see FIG. 3). By using two different grating periods for each of the marks 10 (e.g. 8.0 and 8.8 $\mu$m) and for the corresponding reference structures 26, a much more accurate positioning and a larger capture range may be accomplished (using the so-called Nonius principle). The capture range is the range in which an alignment can be executed without ambiguities. Because of the periodicity of the gratings, however, there is still an inherent ambiguity in the fine positioning. In the case of the combination of the 8.0 and 8.8 $\mu$m gratings, a periodic ambiguity of +/−44 $\mu$m exists, which can lead to one or more 88 μm errors when the initial position of the mark is outside the +/−44 μm range. This effect means that the actual position of the alignment mark 10 may be at a distance of n×88 μm from the detected position.

Coarse Wafer Alignment (COWA) followed by a FIWA may be performed in certain embodiments. In some cases, the COWA and FIWA may be executed simultaneously. The FIWA may be performed using separate marks 10, such as the known 8.0 μm phase grating, or the known combination of a 8.0 μm and 8.8 μm phase grating using e.g. the above described technique using the Nonius principle. Alternatively, the FIWA may be performed using the mark 10 according to an embodiment of the present invention (when these include at least a section with the normal period phase grating). Also, the present method and use of a phase grating as a mark 10 may be applied to check whether the right initial position has been found to perform a FIWA using a single (e.g. 8.0 μm) grating mark (i.e. a confidence check).

The coarse wafer alignment may be effected using a number of different types of phase gratings for the mark 10. The underlying principle of these types is that a non-periodic feature of the phase grating is used to avoid ambiguities that exist when only using the fine wafer alignment method. Thereby, the capture range and/or the robustness of a periodic alignment system (e.g. using 8.0 μm gratings or a combination of 8.0 μm and 8.8 μm gratings) are enlarged beyond the periodicity of that periodic alignment system (8.0 μm and 88 μm, respectively).

The non-periodic feature may be included in the phase grating mark 10 on the wafer in a number of manners. A number of marks according to embodiments of the present invention will be discussed below, together with possible specific processing that may be desirable for such embodiments. In general, two classes of marks 10 are disclosed, i.e. a first class in which the phase of a detected signal is used to determine the mark position (or better: non-periodic feature position), and a second class in which the amplitude of a detected signal is used to determine the mark position.

As a first type of mark 10, a so-called Phase Jump Mark is shown in FIG. 3. In broken lines, the reference grating 26 (e.g. with a periodicity of 8.0 μm) is shown, which is moved relative to the phase jump mark 10 shown in non-broken lines. Such a phase grating mark 10 comprises lines and spaces as conventional alignment marks (e.g. spaced at 8.0 μm), but the periodicity of the grating is broken at one or more positions 15 of the mark, resulting in a phase jump of the mark at this position(s). The phase jump mark 10 may also be described as comprising two parts 11, 12 with a phase grating having the same periodicity of lines and spaces, and a feature region 15 between the two parts 11, 12 where the space is not filled with a phase grating having the same periodicity of lines and spaces as the two parts 11, 12. In a 8.0 μm phase grating, e.g., one of the spaces 15 may be reduced to 4 μm, 4/7 μm, or 200 nm or enlarged to 12 μm (the 12 μm embodiment as shown in FIG. 3). With the 4 μm and 12 μm spaces, and the reference grating overlapping the two parts 11, 12, the phase difference between the reference grating and part 11 would differ by π from the phase difference between the reference grating and part 12.

Because of the non-periodic feature 15 in the periodic grating as shown, a phase change will occur when the reference grating 26 is moved with respect to the phase grating 10 on the wafer W using the alignment subsystem 21 discussed above. This phase change is present in each of the detected orders n of the reflected light beam. The signal received on one or more of the detectors 28, 28a may be processed to derive the phase of the received signal, e.g. by applying a best fit on the measured and processed signal phases in a predetermined position window. At the point in the scanning direction (e.g. the x-direction) where the alignment signal phase changes at maximum speed, the captured alignment mark position 15 is present.

Tests have been performed using a number of different phase changes (4 μm, 4/7 μm, 12 μm and 200 nm), and the captured alignment mark 15 has been detected using different orders of the diffraction grating. It has been found that the 4 μm phase jump mark provides the best results with the lowest order measurements (best reproducibility of results).

Figure 4A:
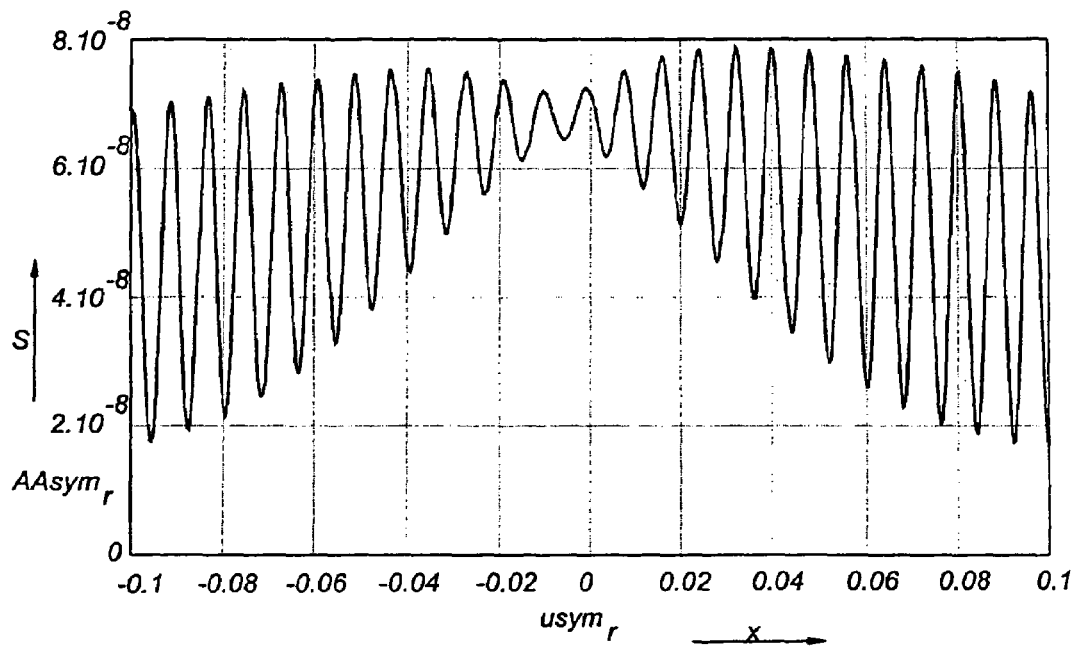
FIGS. 4a and 4b depict an alignment subsystem detection signal for two implementations of the alignment structure of FIG. 3.
Figure 4B:
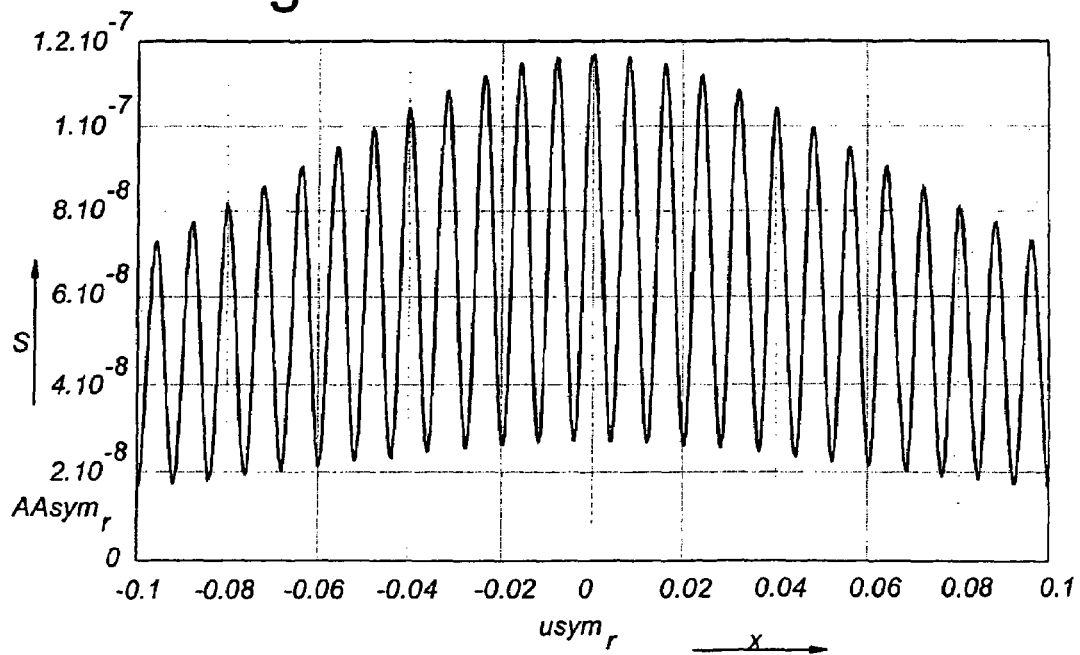

However, it has also been found that in using the phase jump marks 10 with a rather large spacing (4 μm), the detected signal at the actual alignment position is actually the weakest signal over a larger position window. This effect, of course, may result in unreliable results. It has been found that the weak signal is the result of the left and right part of the phase jump mark 10 with a 4 μm spacing being out of phase. When the spacing is made much smaller (in the order of 100 nm, e.g. 200 nm) this signal weakening effect may be much less prominent or even absent, and still the spacing 15 may be large enough to be detected using the phase detection method. In FIG. 4, such an effect is illustrated: FIG. 4a shows the alignment signal S as a function of the displacement x from the alignment subsystem 21 for the phase jump mark having a 4 μm spacing, and FIG. 4b shows the alignment signal S as a function of the displacement x from the alignment subsystem 21 for the phase jump mark having a 200 nm spacing. It can be seen that the alignment signal S for the 200 nm spacing phase jump mark 10 has a larger signal strength at the aligned position than the alignment signal S for the 4 μm spacing phase jump mark 10.

Figure 5:
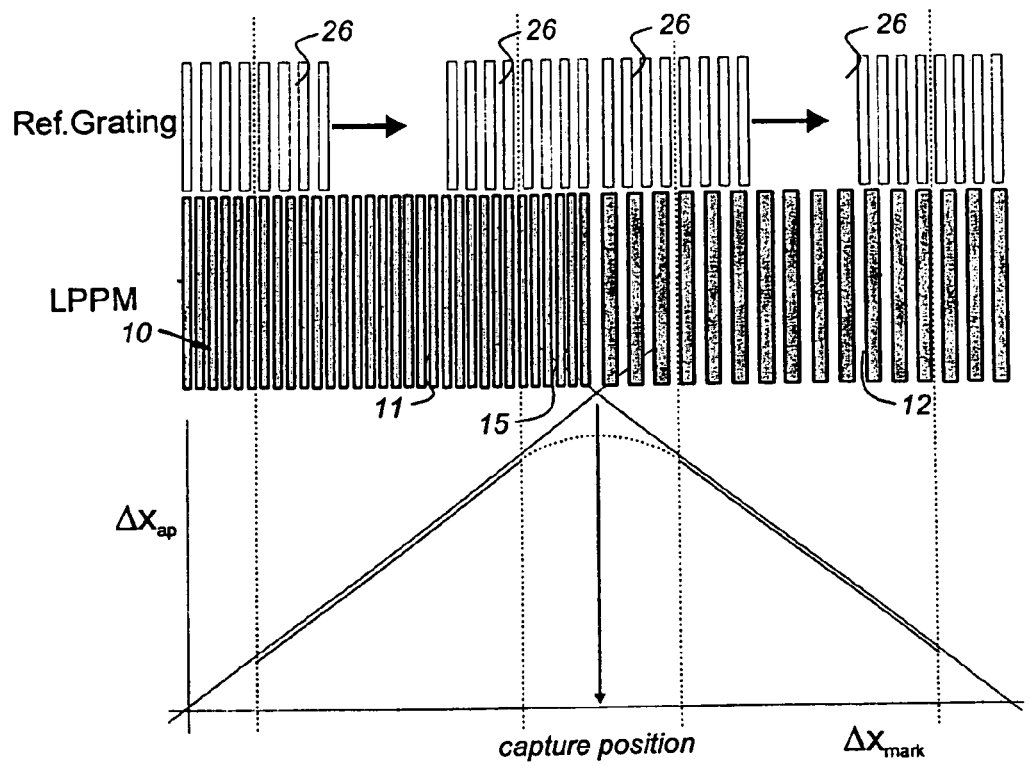
FIG. 5 depicts an alignment structure according to another embodiment of the present invention, in combination with the detected phase signal of the alignment subsystem.

The non-periodic feature of the mark 10 can also be embodied as a linear phase profile mark (LPPM). One such embodiment is shown in FIG. 5. In this embodiment, two parts 11, 12 of the phase grating 10 both have a period (slightly) different from the reference grating 26. When moving the reference grating 26 with respect to the LPPM 10, two linearly varying phase profile signals can be detected.

For one of the LPPM parts 11, 12 (taking the reference grating period of 8.0 μm), the alignment signal then looks like $$S(x) = dc + A\cos\left[\frac{2\pi}{(8+\Delta)}x\right]$$
$$= dc + A\cos\left[\frac{2\pi}{8}\left(x - \frac{\Delta}{8}x\right)\right] \quad (\Delta << 8)$$

It can be seen that the aligned position varies (Δ/8) micron per micron shift of the expected position. To have a non-periodic feature that may allow detection of a unique position, the gratings 11, 12 of the LPPM 10 are constructed such that the detected alignment phase signal $\Delta_{xap}$ shows two slopes with opposite slope sign (See FIG. 5 bottom part). The unique alignment position can than be derived from the intersection of the two slopes.

In this embodiment, it should be kept in mind that the different periods of the LPPM 10 may lead to different diffraction angles, which must still be transmitted by the diffraction order filter 244 (see FIG. 2). The order positions are related to the mark period by $$x_{ord} = n_{ord} \frac{\lambda \cdot f}{d_0}$$

where f is the focal distance and $d_0$ is the mark period. A change in the period of 8 nm will lead to a change in phase slope of 1 nm/μm, which can be accurately measured. A relative period change of 1%o will lead to a shift of the diffraction order of ~3 μm.

The two slopes may be measured using a single reference grating 26 and a single illumination spot or, as depicted in FIG. 5, using two reference gratings 26 and two illumination spots which both move in the direction indicated by the arrow to allow simultaneous determination of the two sloped signals.

Figure 6:
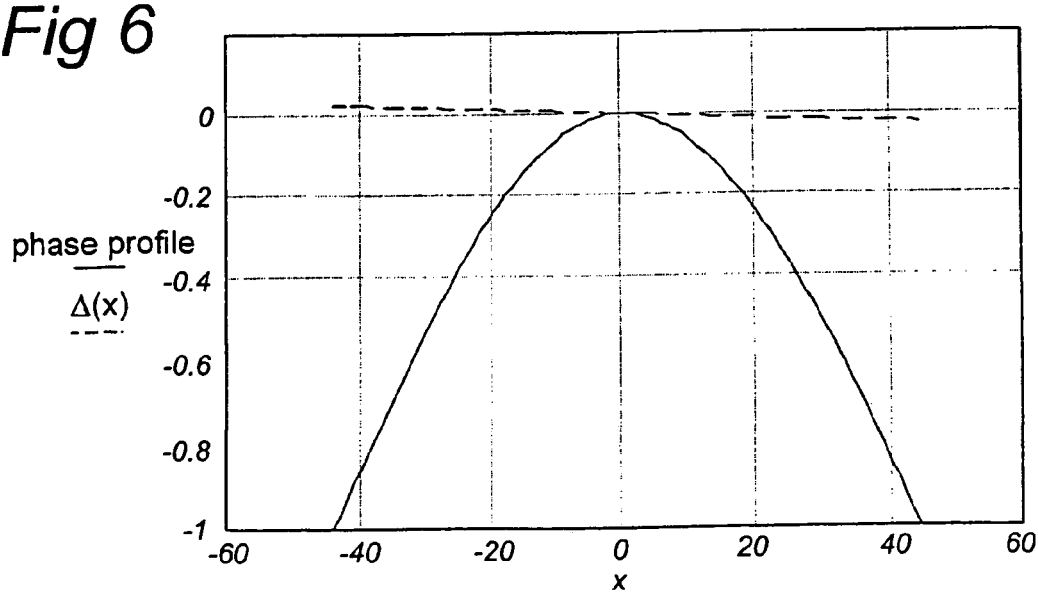
FIG. 6 depicts a position-dependent period change and resulting phase profile of an alignment structure according to a further embodiment of the present invention.

In an even further embodiment of the first class of phase gratings 10, the variation of the grating period has a sinusoidal profile (Sinusoidal Phase Profile Mark or SPPM). The two slopes in the resulting measured signal are then replaced by a sinusoidal shape, of which the top can easily be detected. When the period of the sinusoidal phase profile is much larger than the period of the reference grating (e.g. >8 μm, preferably even >88 μm), a sinus fitting of the detected phase signal profile would provide the capture position 15 of the alignment mark 10. Such a sinusoidal phase profile can be obtained from a position-dependent period change:

$$\Delta(x) = \frac{\cos\left(\frac{2\pi}{L}x\right) - 1}{x} \Rightarrow \text{phase profile} = \cos\left(\frac{2\pi}{L}x\right) - 1$$

where again we have the boundary condition that Δ(x)<<8. In this equation, Δ(x) is the position-dependent period change, x is the distance along the (longitudinal) x-direction, and L is the alignment mark 10 length. An example of the sinusoidal phase profile (solid line), and the associated required position dependent period change Δ(x) (broken line) for the SPPM 10 is shown in FIG. 6.

The second class of marks 10 uses the intensity of the detected alignment signal to provide the capture position of the non-periodic feature 15 of the mark 10.

Figure 7:
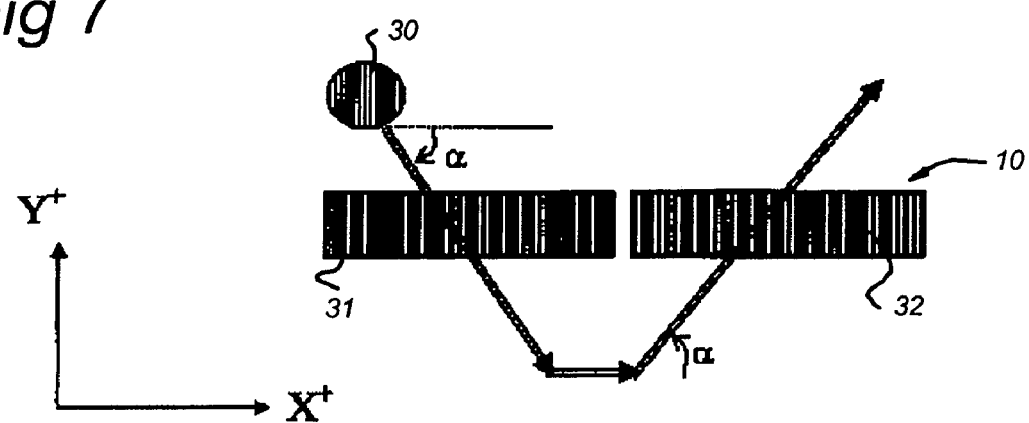
FIG. 7 depicts schematically an alignment subsystem of a lithographic apparatus according to a further embodiment of the present invention.

In a first embodiment of the second class of marks 10, use is made of the finite properties of regularly used marks, such as a versatile scribeline primary mark (VSPM), a regular 8.0 μm phase grating mark or a combination of a 8.0 μm and 8.8 μm phase mark. In an exemplary embodiment, the marks present are scanned under an angle a to the longitudinal direction of the mark 10. The angle α may vary between 0° and 90°, in which α=0° and α=90° are special cases. In FIG. 7, an exemplary arrangement of the scanning with the illumination spot and an existing phase grating mark 10 comprising two separate phase gratings 31, 32 is shown. In this case, both phase gratings 31, 32 present (e.g. an 8.0 μm and a 8.8 μm phase grating) are scanned by an illumination spot 30 with the same (but opposite signed) scanning angle α. In FIG. 7, also a coordinate axis is shown, indicating that the phase gratings 31 and 32 have their longest dimension in the x-direction and a smaller dimension in the y-axis.

Figure 8:
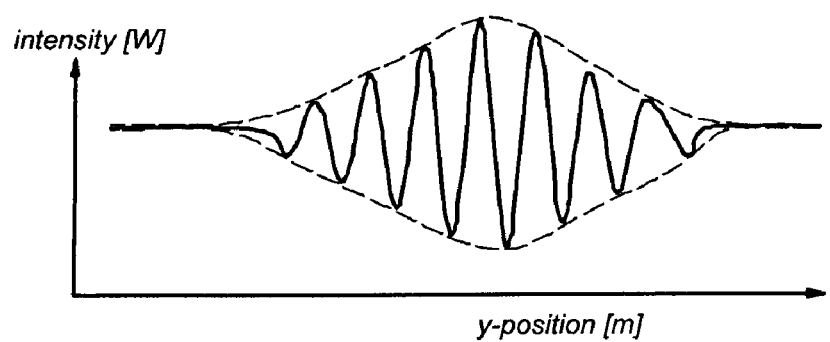
FIG. 8 depicts a detected signal of the alignment subsystem of FIG. 7.
Figure 9:
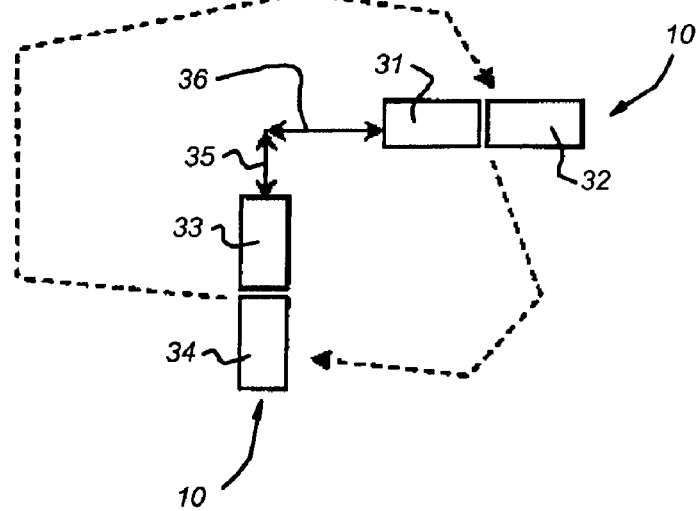
FIG. 9 depicts an alignment procedure for a wafer using the embodiment of FIG. 7.
Figure 10:
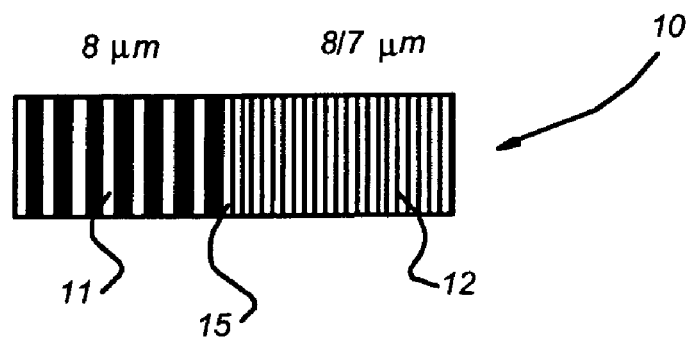
FIG. 10 depicts an alignment structure according to a further embodiment of the present invention.

The intensity signal detected by the alignment subsystem 21 for a single scan (e.g. left part in FIG. 7, detecting the 8.0 μm grating 31) is shown in the plot of FIG. 8 as a function of the y-position. In FIG. 8, also the envelope of the detected signal is shown by the broken line, which allows a determination of the capture position. The detected capture position in this case, however, is the capture position in the direction (y-direction) perpendicular to the longitudinal direction (x-direction) of the phase grating 31. When both phase gratings 31, 32 are used as shown in FIG. 7, a more robust result of the capture position may result.

The diagonal scan method as discussed with reference to the embodiment shown in FIG. 7, may also be executed using only a single grating 31.

The envelope of the intensity signal obtained from a phase grating 31, 32 extending in the x-direction provides the capture position of the phase mark 10 in the y-direction. In a similar manner, the capture position of a phase mark 10 extending in the y-direction will provide a capture position in the x-direction. When phase marks 10 are present on the wafer in both the x- and y-direction in a known configuration (i.e. with known mutual offsets 35, 36, see the example shown in FIG. 9 with two phase gratings 31, 32 extending in the x-direction and two phase gratings 33, 34 extending in the y-direction), the found capture positions in the x- and y-direction can be used as expected positions in a normal coarse alignment procedure (e.g. using a combination of 8.0 μm and 8.8 μm phase gratings as described above). Sometimes, it may still be desirable to perform a coarse alignment. For example, the accuracy of the diagonal scan procedure (the envelope signal), e.g. 30 μm dependent on the width of the phase grating marks 10 used, may be sufficient to determine the correct top in a 88 μm periodic signal (as delivered by the 8.0/8.8 μm phase. grating combination discussed above), but not sufficiently accurate to determine the correct top in a 8.0 μm periodic signal.

Such a diagonal scan method may prevent making a periodic error, as during a scan of a phase grating 31 . . . 34, when there will only be one distinct envelope shape present in the detected signal. When no signal (or a signal below a predetermined threshold) is received at all using the alignment subsystem 21, this result indicates that the phase grating mark 10 has been missed. Then, the search window of the alignment subsystem 21 should be extended or shifted (e.g. with a positional shift equal to the (known) length of the phase grating 31 . . . 34). The diagonal scan method may be particularly suited to check whether the detected position of the wafer alignment, using a detection method having possible periodic errors, is correct (confidence check).

For α=0°, the non-periodic feature 15 of the mark 10 is the start and end of the phase grating 31 . . . 34 in the longitudinal direction of the phase grating 31 . . . 34. The capture position (either the first edge or the second edge of the phase grating 31 . . . 34, or a combination thereof) may be derived from the envelope of the detected alignment signal, the length of which should generally correspond to the length of the phase grating 31 . . . 34.

For α=90°, the non-periodic feature of the phase grating is the start and end of the phase grating 31 . . . 34 in the cross direction (i.e. perpendicular to the longitudinal direction). In this case, a capture position in one direction (e.g. y-direction) may be determined using the x-direction phase grating 31, 32. In this case, when the reference grating 26 and the phase grating mark 10 happen to be aligned so that they are exactly out of phase, it is possible that no signal is detected at all using the alignment subsystem 21. This effect can also happen when the angle is very near to 90° and the lines are less wide than the spaces. However, a new scan with a very small change in the longitudinal direction of the phase grating mark 10 will then provide sufficient signal to determine the capture position in the y-direction. This special case of the diagonal scan may have a further disadvantage compared to the diagonal scan with an angle $0° \leq \alpha < 90°$. For the case of $\alpha = 90°$, the alignment subsystem may only detect the envelope signal and may not detect an alignment signal in which also the periodic features of the phase grating 31 . . . 34 are present (which would allow the signal also to be used for further (fine) wafer alignment).

The diagonal scan method of the alignment subsystem may provide a number of further advantages, which may be predominantly present for the cases in which $0 < \alpha < 90°$. The scan doesn't necessarily use more time than conventional scans, as the signal acquisition for capturing and aligning can be performed simultaneously. Also, it is possible that no further hardware needs to be added to the alignment subsystem 21, as the illuminating beam (spot 30) and associated drive means, and the detectors 28 and associated processing elements 29 may already be present. As the diagonal scan may use the same marks 10 on the wafer W as used for the fine wafer alignment, no further space may be needed in the scribelanes on the wafer W. The robustness of the diagonal scan method may be the same as for the existing fine wafer alignment: when a phase grating mark 10 can be detected using the normal (x-direction) scanning of a phase grating mark 10, the phase grating mark 10 may also be detected using the diagonal scanning method. In present systems, the choice of the size of the illuminating beam is a trade off: for optimal performance it may be desirable for the beam to be very small to prevent cross talk with other features on the wafer W. However, a very small illuminating beam may enlarge the chance of missing the phase grating mark 10 at all. Using the diagonal scan, however, the chance of actually hitting the phase grating mark 10 (which is much longer than wide) may be greatly enhanced, allowing to actually use a small illuminating beam.

In a further embodiment of the present phase grating mark of the second class (intensity detection), the mark comprises a first part with a periodicity of, in general, $X \mu m$ (e.g. X=8.0 $\mu m$), and an adjacent second part with a periodicity of $X/n$, n being an integer number (e.g. n=7). This embodiment is shown schematically in FIG. 10 in which the mark 10 comprises a first part 11 with a periodicity of 8 $\mu m$ and a second part 12 with a periodicity of $8/7 \mu m$. When detecting the n-th order diffraction of this mark 10, signals with the same periodicity may be detected over the entire mark 10, but there may be a noticeable change in intensity at the changeover 15 from X to X/n periodicity. This effect may allow the detection of the capture position 15 of the mark 10. For a robust and effective error free detection of the capture position 15, it may be desirable for the change in signal from the alignment subsystem 21 to be as clear as possible, but still, it may be desirable for a signal to be detected from both parts 11, 12 of the mark 10. In practice, this effect implies that e.g. a combination of a 8 $\mu m$ and $8/7 \mu m$ (or $8/5 \mu m$) phase grating will provide a workable mark 10 for coarse wafer alignment.

In an alternative version, not the periodicity is changed over the mark 10, but the duty cycle of the spaces and lines is changed at one or more positions in the phase grating 10. Duty cycle is the ratio of the width of a line and a space in the alignment structure. Under normal circumstances, phase gratings 10 are provided with lines and spaces of equal dimension (duty cycle 50%). When the duty cycle of the lines and spaces is changed, this result may be noticeable in the amplitude of the signal from the alignment subsystem 21 and may indicate the capture position 15 of this embodiment of the mark 10.

Figure 11:
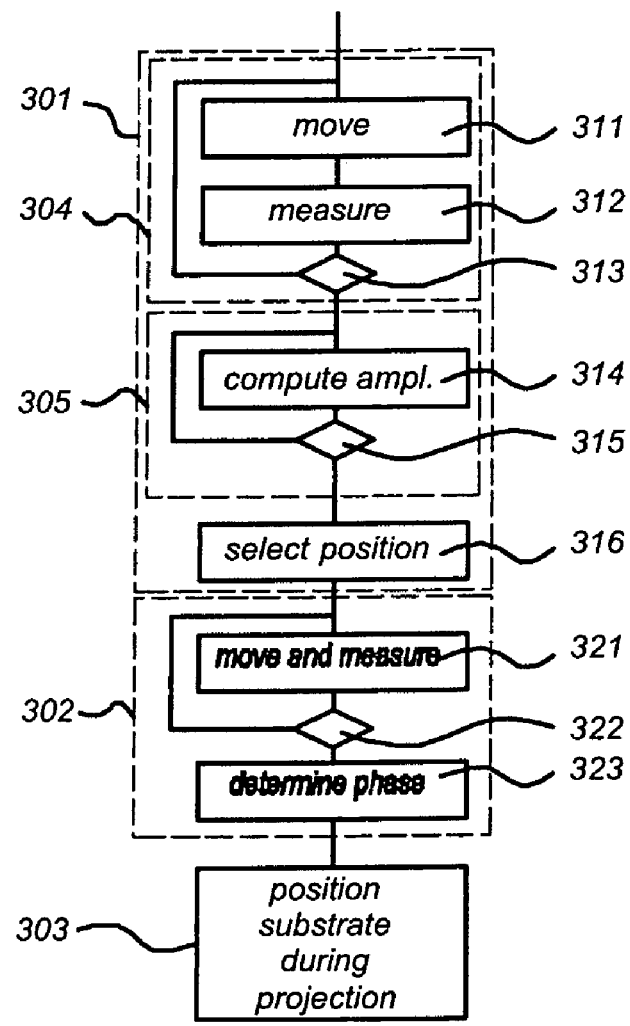
FIG. 11 depicts a flow-chart for a method of aligning a substrate and a mask pattern according to an embodiment of the invention.

FIG. 11 shows a flow chart of part of the operation of processing unit 29. The flow-chart contains a prepositioning stage 301, an alignment measurement stage 302 and a positioning-during-projection stage 303. The prepositioning stage contains a number of steps. The steps of the flow chart are implemented, for example, by providing a suitable program of instructions in an instruction memory (not shown) of processing unit 29 for execution by a conventional computer (not shown) in processing unit 29.

Prepositioning stage 301 contains first, second and third tasks 304, 305, 316. In first task 304 of the prepositioning stage, processing unit 29 causes measurement of signals from detector 28 (and optionally from detector 28*a* and further detectors) at a series of positions of substrate W. For this purpose, first task 304 may include a first subtask 311 of moving the substrate or wafer W to a series of positions relative to the measuring subsystem and a second subtask 312 in which an intensity signal from detector 28 is measured at these positions. The range of these positions is substantially larger than the size of reference structure 26 (and the illumination beam 30). A third subtask 313 ensures that the first and second subtasks are repeated for different positions.

Figure 12:
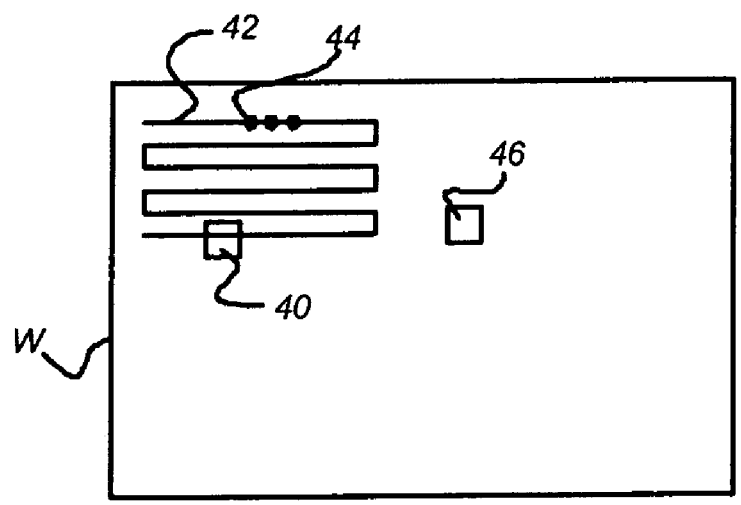
FIG. 12 depicts a top view of part of a substrate.

FIG. 12 shows a top view of part of a substrate W with an alignment structure 40. A scanning path 42 has been indicated. Path 42 is not part of substrate W, but indicates successive locations 44 of substrate W at which radiation source 20 provides spots of light on substrate W which are imaged onto reference structure 26, during subtask 311. In an embodiment, the apparatus is arranged to scan along a meandering path of lines. This arrangement may provide for a two-dimensional search area with minimal movement. Window 46 indicates the size of an area of points on substrate W that are imaged onto reference structure 26 at a single time. As can be seen, the image of alignment structure 40 may overlap with reference structure 26 only for a limited number of positions along scanning path 42 as indicated by the line (path 42) crossing the alignment structure 40.

In a second task 305 of prepositioning stage 301, processing unit 29 computes amplitude information for a number of positions along scanning path 42. For this purposes second task 305 may contain a first subtask 314 in which the intensity amplitude information is computed. A second subtask 315 ensures that the first subtask is repeated for a number of positions. Although first task 304 and second task 305 have been shown separately for the sake of clarity, it should be appreciated that both steps may be integrated, the amplitude information being computed as the measurements come in. Such an arrangement may reduce the need for memory for storing measurements that are still needed for amplitude computations.

Figure 13:
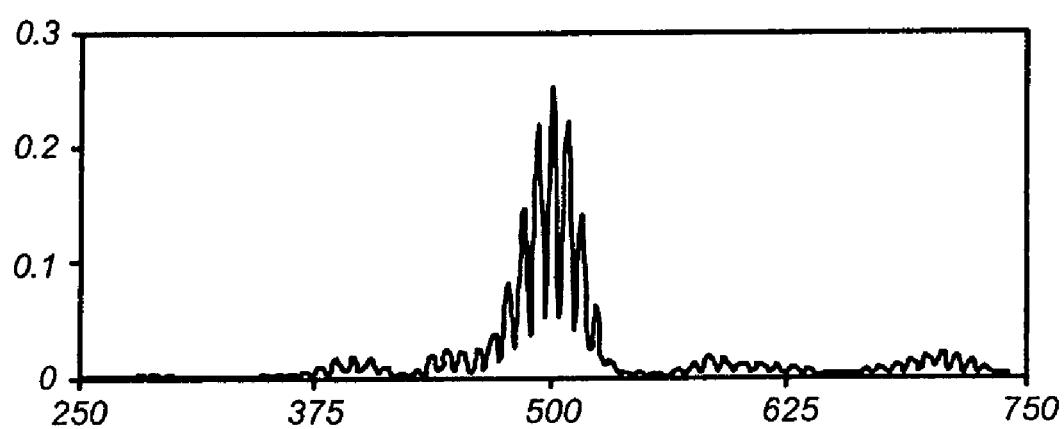
FIG. 13 depicts a detection signal.

FIG. 13 shows an output signal of detector 28 as a function of position (in micrometers) along a horizontal part of scanning path 42 along substrate W as a continuous curve (although, in practice, measurements of the output may be performed only at certain sampling positions). At positions (around 500 micrometer) where the image of alignment structure 40 overlaps reference structure 26, the output signal varies periodically as a function of position. At other positions, a more or less random variation of smaller amplitude occurs, e.g. due to structures present in substrate W that are not alignment structures (such as circuit structures, in the case of a semi-conducting manufacturing process). When only selected pairs of orders of diffraction are used, the more or less random variations may involve amplitude and phase variations of a sine wave with a period corresponding to the selected orders of diffraction.

In the first subtask 314 of the second task 305, processing unit 29 computes amplitude information of the variations of the output signal for a number of positions (with coordinates x,y on substrate W as measured by interferometric measuring structure IF) along scanning path 42. The computation of the amplitude information involves determining a measure of the amplitude of the variations of the output signal. For substrates W that do not produce much output signal in the absence of the alignment structure, it may suffice to detect the amplitude, for example by taking the difference between minima and maxima (at different positions), or by measuring the maximum deviation from the average output signal value. For other substrates W, a certain amount of spatial filtering may be preferred to suppress the amplitudes of output signal variations that do not have the spatial frequency expected for the alignment structure. This effect may be realized, for example, by band pass filtering the output signal prior to amplitude measurement, or by correlation techniques that are selectively sensitive for the expected output signal from alignment structure 40.

As one example of the computation in first subtask 313 of second task 305, processing unit 29 computes the amplitude information according to $$A2(x,y)=(\text{Sum } \cos(k(x-x'))s(x',y'))^2+(\text{Sum } \sin(k(x-x'))s(x',y'))^2.$$

The sum is over locations with coordinates x', y', including at least a series of locations with different x' coordinate values spaced less than the width of an alignment structure from one another. In the example, A2(x,y) is the amplitude information A2 for a location with coordinates x,y as determined from the output s(x',y) of detector 28, with the substrate positioned at a locations with coordinates x',y'. The parameter k is equal to $2\pi/p$, where p is the period of the image of the alignment structure 40 onto reference structure 26, 26a. The range of coordinates x',y' extends over a window that extends around the position with the coordinates x,y for which the amplitude information is computed. The size of the window can be selected freely. A larger range may ensure larger frequency selectivity, making false detection of alignment structures less likely, but may reduce position accuracy and vice versa. Preferably, the range of x',y' values that contributes to the sums is taken to have approximately the same size as alignment structure 40.

In a fourth task 316 of prepositioning stage 301, processing unit 29 uses the computed amplitude information to select a position (x0, y0) where the computed amplitude information is maximal as a function of a and y.

Although a formula for A2 has been given, by way of example it should be appreciated that without deviating from the invention other types of formula may be used. For example, a formula for the derivative of A2 with respect to x may be computed to locate the maximum, or a product with a weighting functions W(x−x', x−y') included in the sums, possibly with W decreasing as x' and/or y' move away from x,y.

In principle, measurements from a detector 28 for a single pair of diffraction orders may suffice to find the maximum. Optionally, similar determinations of amplitudes for different pairs of diffraction orders may be used, either to compute a combined amplitude function or to confirm whether a maximum occurs for all pairs of orders of diffraction prior to using the location of the maximum.

Alignment measuring stage 302 is comparable to prepositioning stage 301, except that instead of an amplitude a phase is determined. Moreover, in alignment measuring stage 302, it may be desirable to make measurements only at positions where the alignment structure is at a position from which it images onto reference structure 26.

In alignment measuring stage 302, processing unit 29 executes a first subtask 321 similar to first and second subtasks 311, 312 of prepositioning stage 301, involving moving to a number of locations and measuring output signals of detector 28 for different positions of substrate W. A second subtask 322 ensures repetition at a number of different locations relative to the alignment subsystem: These different locations have coordinates (x", y0) that are selected dependent on the position (x0, y0) produced in fourth task 316, with coordinates (x", y0) wherein x" is varied over a range around x0. In a third subtask 323, processing unit 29 computes a phase value $\phi$ from these measurements, for example using a formula such as $$tg(f)=a/b$$

where $$a=\text{Sum } \sin(k(x''-x0))s(x'',y'')$$

$$b=\text{Sum } \cos(k(x''-x0))s(x'',y'')$$

The sum is over a range of locations with different x". It may be desirable for the different x" values to extend over a range that is equal to the size of alignment structure 40, and/or it may be desirable for the different x" values to be spaced by less than a period of reference structure 26. It is possibl that choice of the y" values do not appreciably affect the computation, as long as they are within the size of the alignment structure, and it may be desirable to use a range of y" values in the sum. The computed phase value is proportional to the displacement between x0 and a reference position xr on substrate W divided by the period p with which alignment structure W is imaged onto reference structure 26:

$$f=2\pi(x0-xr)/p$$

Thus the phase value provides accurate position information of alignment structure 40 relative to the alignment sub-system. In positioning-during-projection stage 303 of the flow-chart, processing unit 29 uses this information to position substrate W at a series of required positions relative to the patterning structure.

It may be desirable for the determination of the phase to be performed for a number of pairs of orders of diffraction and/or for a combination of the computed phases to be used to determine the position of the alignment structure.

It will be appreciated that different kinds of determinations of xr may be used. For example, a weight function W(x"−x0, y"−y0) may be used in the sums, or a recursive process may be used to adjust x0 until "b" becomes zero, in which xr may coincide with the adjusted x0.

It should be noted that the formulas for the phase $\phi$ and the amplitude A2 may use the same type of elements: summing cosine functions and sine functions. Nevertheless, the formulas may lead to two different types of information. The phase value $\phi$ may vary linearly substantially in the same way as a function of position x0, no matter how wide the range of positions (x",y") over which the sums are taken. The amplitude information A2, in contrast, may increase in strength as this range increased, be it with an accompanying decrease in position dependence. This effect may make the amplitude information suitable for searching among areas that do not contain the alignment structure and/or the phase information suitable for accurate positioning once it is known where the alignment structure 40 is located. The use of similar elements may also make it possible to use much of processing unit 29 for both computations.

The determination of reference position xr from phase value φ may be ambiguous, in the sense that any value of xr that differs by a integer multiple of the period p could be determined. Under some circumstances, the prepositioning accuracy may be sufficient to identify a single xr value as the correct value, but generally this is not the case. Therefore, it may be desirable to provide one or more additional spatially periodic alignment structures on substrate W at predetermined relative positions with respect to alignment structure 40. The period or periods of this additional alignments structure or structures may differ from the period of alignment structure 40. Similarly, it may be desirable to provide the alignment sub-system with additional reference structures, detectors etc. to determine the phase of the intensity variations due to displacement of the substrate relative to the alignment sub-system. Phase values determined in this way make it possible to increase the distance between ambiguous xr values up to a point that the prepositioning accuracy suffices to select the correct xr value. Alternatively, the additional alignment structures may be measured using the same reference structure. Such an arrangement may allow prediction of the differences in aligned positions coming from the different alignment structures based on a model and a priori information on the shape and relative positions of the additional alignment structures and the first alignment structure.

In principle, the phase φ may only provide information about the position of the alignment structure in a direction along which the optical properties of alignment structure 40 vary periodically. Therefore, it may be desirable to provide one or more further alignment structures, reference structures etc. with periodical spatial variation in a direction transverse to the period of alignment structure 40 (e.g. perpendicular). It may be desirable to provide these one or more further alignment structures at predetermined positions relative to alignment structure 40. During alignment stage 302, these one or more further alignment structures may be used to obtain additional phase values for accurately positioning substrate W in the direction transverse to the direction perpendicular to the period of alignment structure 40.

It may be desirable for processing unit 29 to use the position (x0,y0) selected in third task 316 to control the positions of substrate W where the phase value of the additional alignment structure or structures and the one or more further alignment structures is determined, using amplitude information obtained by using at least one of the alignment structure, the additional alignment structures and the further alignment structures. Using a single one of the alignment structures for pre-positioning may simplify processing and is usually sufficiently accurate, both in a direction perpendicular to the period of that alignment structure and in directions transverse thereto. But e.g. when increased pre-positioning accuracy is required, a combined amplitude value for different alignment structures may be used, for example by summing amplitude information obtained for different alignment structures, taking account of the predetermined offset of these structures on substrate W.

Figure 14:
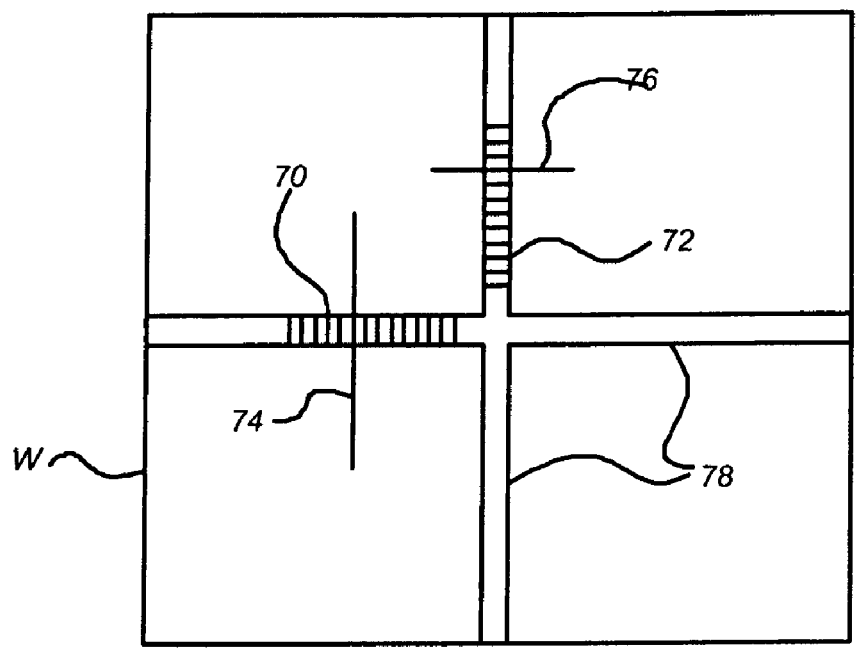
FIG. 14 depicts a further top view of part of a substrate.

FIG. 14 depicts a further top view of part of a substrate W. By way of example, substrate W may be a semi-conductor substrate on which areas for different integrated circuit chips are reserved. Between the areas for the integrated circuit chips, scribe-lanes 78 are provided which may be sacrificed when substrate W is mechanically split into different integrated circuit chips. Periodic alignment structures 70, 72 are present in the scribe-lanes 78. For the sake of clarity, only two periodic alignment structures 70, 72 are shown, but it should be understood that more may generally be present. As shown in this figure, the optical properties of the alignment structures 70, 72 may vary periodically along the direction in which scribe-lanes 78 run, i.e. in the horizontal direction for horizontal scribe lanes between rows of integrated circuit chips and in the vertical direction for vertical scribe lanes between columns of integrated circuit chips.

In this embodiment, the extent of a periodic alignment structure 70, 72 transverse to the direction of the scribe lane in which it is incorporated may be relatively narrow compared with its extent along that direction. Scanning paths 74, 76 run transverse to the direction in which the optical properties of periodic alignment structures 70, 72 vary periodically.

In a method according to an embodiment of the invention, the amplitude of the periodic variation of the intensity of the measured light for a particular alignment structure is determined as a function of position along the scanning path 74, 76 transverse to the direction in which the optical properties of periodic alignment structures 70, 72 vary periodically (non-scan direction). To determine the amplitude of the variation, it may be desirable for the intensity of the measurement light for each position along the scanning path 74, 76 to be measured at a number of different positions in the direction in which the optical properties of periodic alignment structures 70, 72 vary periodically (scan direction). The position transverse to the direction of the scanning path may be determined where the amplitude shows best overlap of mark and reference structure. Typically, this is a position where a maximum amplitude occurs, but in case of a trapezoid shape of the maximum it may be possible for any position in a region with level maximum amplitude as a function of position to be used. This method may be done for periodic alignment structures 70, 72 in two mutually transverse scribe lanes.

The results may be used to control respective components of the position where the phase will be measured to realize accurate alignment. That is, the position of the maximum along the scanning path 74 transverse to the alignment structure 70 with optical properties that vary periodically in the horizontal direction may be used to determine the vertical position component of alignment structure 72 for accurate alignment, and the position of the maximum along the scanning path 76 transverse to the alignment structure 72 with optical properties that vary periodically in the vertical direction may be used to determine the horizontal position component of alignment structure 72 for accurate alignment.

When the maxima are determined in scanning directions in which the alignment structures 70, 72 are relatively narrow, an accurate position can thus be determined. More generally, when the image of the alignment structure is narrow, an accurate position may be realized in this way (a narrow image may be a result of a narrow alignment structure, but also of imaging, for example of a form of filtering of orders of diffraction that passes a wider bandwidth transverse to the direction of periodic variation). Moreover, when the alignment structures generally extend over a relatively large extent transverse to the scanning path, pre-positioning is usually sufficiently accurate so that the apparatus may need to try only one transverse scanning line for one alignment structure.

Only for small alignment structures, several parallel scanning paths may need to be -used, such that the scanning path where the highest maximum occurs may be identified and used to determine the position.

To determine the amplitude for a position along a scanning path 74, 76, it may be desirable for a plurality of measurement intensities for each position along the scanning path 70, 72 to be measured at a number of different positions in the direction in which the optical properties of periodic alignment structures 70, 72 vary periodically. For example, a meandering scanning path may be used which extends far less in the direction of periodic variation than in the transverse direction, or a series of short scans along the direction of periodic variation at a number of positions in the transverse directions.

However, alternatively only a single intensity measurement may be used for each position along the scanning path 74, 76, which in this case runs perpendicular or under a non-zero angle to the direction of periodic variation. Thus, a intensity measurement for the same phase may be obtained at each position along the scanning path 74, 76. As a result, the relative maximum among these measurements may still be characteristic for maximum amplitude. However, this approach may have a risk that an inconvenient phase is used. Therefore, it may be desirable to determine the maximum for at least two parallel scanning paths that are a quarter of a period (plus any number of full periods) apart, although it may also be possible to use any other distance unequal to an integer number of half periods.

As described, alignment may be performed in a number of distinct stages and steps. It will be understood that a decomposition into stages and tasks may merely serve to facilitate explanation of the alignment process. In practice, the various stages and steps need not be distinct. For example, the phase may be determined from stored intensity measurements that have been obtained before, after, or concurrently with (or are indeed part of) the measurements that are obtained at a series of relative positions of the substrate and the alignment measuring system for determining the position of maximum amplitude. In such case, the determination of the location of maximum amplitude may merely serve to select which of the stored intensity measurements should be used. Alternatively, separate intensity measurements performed at locations selected under control of the location of maximum amplitude may be used for determining the phase. This approach may require less storage space for measurements, but it may increase the time needed for alignment, since substrate W may have to be moved to the selected locations.

Furthermore, although it may be desirable to use a suitably programmed computer or set of computers for the determination of phase and amplitude, as well as the search for the relative position of substrate and alignment measuring system that leads to maximum amplitude, it will be understood that dedicated (not programmable, or only partly programmable) elements may be used to perform any one or a combination of these operations. For example, a digital signal processing circuit may be used to perform the filter operations that filter out intensity variations of the expected frequency and to compute the phase and amplitude. As another example, specialized hardware amplitude detection circuitry may be used, e.g. circuitry such as used for AM radio demodulation may be coupled to detector 28.

Figure 15:
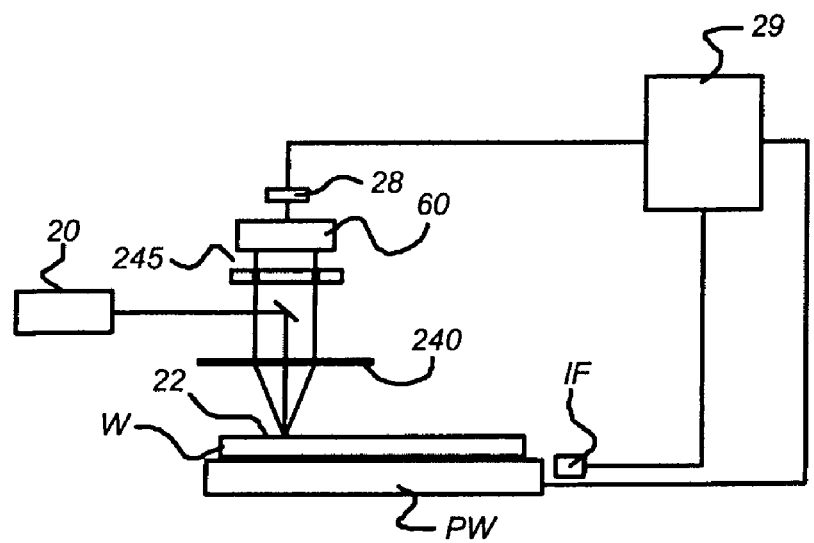
FIG. 15 depicts an alternative alignment subsystem.

FIG. 15 shows an alternative alignment system. Herein reference structure 26 has been omitted. Instead a rotating element 60 has been added, which combines light diffracted in orders of diffraction with mutually opposite sign +n, −n rotating the image of the alignment structure of the opposite orders over 180 degrees relative to one another, e.g. rotating one over 90 degrees and the other over −90 degrees. Such a structure has been described in European patent application No. EP 1148390. The intensity of the combined light is measured at a detector 28. In this case, it is possible that no reference structure is needed in front of detector 28. The output of detector 28 may be used in the way described for FIG. 2.

In a lithographic apparatus according to an embodiment of the invention, a alignment subsystem may be further arranged to use a non-periodic feature provided on the alignment structure which is detectable as a capture position or a check position. A check position may e.g. be used as a starting point for further alignment or as a confidence check.

By including a non-periodic feature in the alignment structure, which can be detected using the normal alignment subsystem, a precise capture point or position for starting a fine wafer alignment can be provided by such a lithography apparatus. Such a capacity may allow removal of a periodic error ambiguity of existing (fine) wafer alignment methods, in any case beyond the periodicity of the fine alignment method. Alternatively, the lithographic apparatus may be used to check afterwards (i.e. after or during alignment of the wafer) whether or not a periodic error has been made. For example, using the present alignment subsystem embodiment a priori, the capture range of the alignment subsystem may be extended, and using the alignment subsystem a posteriori as a check may increase the robustness of the alignment subsystem.

The non-periodic feature of the alignment structure may either induce a detectable phase shift in the detected signal, or a detectable intensity shift of the detected signal. Various embodiments exist which each may provide their own specific advantages.

In one embodiment of the phase shift inducing non-periodic feature, the non-periodic feature is formed by a phase shift between two parts of the alignment structure by a change of the width of one (or more) of the lines or spaces of the alignment structure. In this case, the alignment structure has two parts with the same periodicity of lines and spaces, but one (or more) of the spaces is reduced or enlarged in length to provide the non-periodic feature. One exemplary form reduces the space at the intersection of the two parts to half the periodicity of the phase grating (e.g. 4 $\mu$m in the case of a 8.0 $\mu$m phase grating) or extends it to one and half the periodicity (i.e. 12 $\mu$m for the same phase grating). Effectively, in the transition region, the contributions to the measured signal of the alignment subsystem is then exactly in opposite phase for the two parts, which allows easy detection of the capture position (i.e. the position where the phase gradient of the detected signal is maximum).

However, due to the opposite contributions, problems may anfse due to the resulting low amplitude of the detected signal. This effect may be prevented by making the space even smaller (e.g. 200 nm in the case of a 8.0 $\mu$m phase grating), which results in a detected signal in which the phase change is still detectable, while the amplitude of the detected signal remains high.

In a further embodiment of the phase-shift inducing system, the optical interference arrangement comprises a reference grating, and the non-periodic feature comprises a transition from a first part to a second part of the alignment structure. The first part has a periodicity which is less than the periodicity of the reference grating, the second part has a periodicity which is greater than the periodicity of the reference grating, and the alignment subsystem is arranged to detect the capture position or check position from the resulting sloped phase information of the measurement light. Here, again, periodicity is the dimension of a single period in a periodical system, i.e. the dimension of a combination of a line and a space (greater periodicity thus means that the distance between two consecutive lines is larger). By properly selecting the periods of the first and second part of the alignment structure with respect to the reference phase grating, the phase of the detected signal may be made to change linearly with varying mutual displacement, but with opposite sign for the first part and second part. The capture position or check position can then be derived from the intersection of the two sloped phase signals.

The resulting phase of the detected signal may in a further embodiment have the form of a sinusoidal shape, which allows an easy detection of the capture position, e.g. using a sinus profile fitting of the detected phase signal. For this, the alignment structure may comprise a position-dependent period change according to $$\Delta(x) = \frac{\cos\left(\frac{2\pi}{L}x\right) - 1}{x}$$

in which $\Delta(x)$ is the position-dependent period change, x is the position along the alignment structure, and L is the length of the alignment structure over which the phase should vary, and the alignment subsystem is arranged to detect the capture position or check position from the resulting sinusoidal shaped phase information of the measurement light.

Advantageously, the sinusoidal phase profile mark may be designed such that the resulting sinus curve of the phase of the detected signal has a period which is much larger than the periodicity of the fine alignment method (e.g. greater than 88 $\mu$m).

For the second class of marks, in which the intensity of the detected alignment signal is used to determine the capture position or check position, a first embodiment utilizes the finite dimension of the alignment structure as a non-periodic feature. In this case, the alignment subsystem is arranged to detect the capture position from the envelope of the intensity of the measurement light. In general, alignment structures in phase grating alignment systems are longer than they are wide, and the fine wafer alignment is executed using a scan of the alignment structure along its longest direction. To find a capture position for the coarse wafer alignment, the envelope of the detected alignment signal corresponds with the dimensions of the alignment structure used, and thus allows a capture position to be found.

In a further embodiment, the alignment structure has a first dimension in a first direction and a second dimension in a second direction, in which the second direction is substantially perpendicular to the first, and in which the non-periodic feature is the first and/or second dimension of the alignment structure. This first and/or second dimension may be detected using a scan of the alignment mark at an angle $\alpha$ between 0° and 90° with the first direction.

This embodiment may be used for all kinds of alignment structures, and is also called diagonal scan. When the scan is performed at an angle a to the first direction, the capture position in the second direction may be found. In general, alignment is performed in both the first and second direction, using mutually perpendicular alignment structures. So when scanning a first alignment mark (extending in the first direction), a capture position may be derived for the second alignment mark (extending in the second direction), and vice versa.

In a further embodiment, the diagonal scan is performed at an angle $\alpha$ larger than 0°. For example, it may be desirable to perform the scan at an angle $\alpha$ larger than 10°, e.g. at an angle $\alpha$ of 45°.

This embodiment may also be used when two alignment structures are present on the wafer for the alignment subsystem (e.g. a 8.0 $\mu$m and a 8.8 $\mu$m phase grating). After a diagonal scan is performed at an angle $\alpha$ to the first direction for the first alignment structure, the scanning is repeated for the second alignment structure, but now at an angle $-\alpha$ to the first direction. This approach may provide a capture position with a higher confidence (more robust solution).

For $\alpha=0°$, the scanning may be performed along the first direction only. Due to the finite dimension of the alignment structure, also in the first direction, this approach may provide a capture position in the first direction.

For $\alpha=90°$, the scanning may be performed along the second direction of the alignment structure. As the dimension of the alignment structure in the second direction is precisely known, this approach may allow determination of a capture position in the second direction, which may be used when performing fine alignment using a second alignment structure. In this case, it is possible that the reference grating and the alignment structure are precisely aligned, so that a very small resulting signal is detected. This effect may be prevented e.g. by using a reference grating with a periodicity different from the alignment structure, or by performing a new scan at a slightly offset starting position.

In a still further embodiment, the non-periodic feature is formed by the transition from a first part of the alignment structure to a second part of the alignment structure, the first part having a periodicity of X $\mu$m and the second part having a periodicity of X/n $\mu$m, n being an integer number. The alignment subsystem is arranged to detect the capture position or check position from a change in the intensity of an n-th order of diffraction of the measurement light. Two-part alignment structures may be relatively easy to produce, especially when choosing the parameters correctly. It may be desirable to take care that the shift in intensity of the detected alignment signal is large enough to be detected reliably, but also that the lower signal still has a sufficiently high amplitude. The invention could be implemented using a combination of a 8.0 $\mu$m part and a 8.0/7 $\mu$m part. Also the combination of X=8.0 $\mu$m and n=5 (grating period of 8.0 and 1.6 $\mu$m, respectively) may be implemented, as well as other suitable combinations.

In an alternative embodiment of a two-part alignment structure, the non-periodic feature is formed by the transition from a first part of the alignment structure to a second part of the alignment structure, the first part having a first duty cycle value of the lines and spaces and the second part having a second duty cycle value of the lines and spaces, and the alignment subsystem is arranged to detect the capture position or check position from a change in the intensity of the measurement light. Duty cycle is the ratio of the width of a line and a space in the alignment structure. As a different duty cycle of a phase grating in combination with the optical interference arrangement may result in a different amplitude of the detected signal, this approach may allow detection of the capture position.

Further embodiments of the present invention provide for alignment of the substrate and the patterning structure in which a smaller alignment structure on the substrate suffices to provide for alignment and pre-positioning.

In a method according to an embodiment of the invention, alignment under control of phase information involves a selection task, wherein a position of the substrate is selected so that the alignment structure and the reference structure are in an overlapping imaging relationship. The selection task may involve determining the amplitude of intensity variations of the measurement light output from the interference arrangement and/or a search for a position of the substrate so that the alignment structure and the reference structure are in an overlapping imaging relationship. For such purpose, intensity measurements may be subjected to different processing for the alignment task and for the pre-positioning task, respectively. During alignment, the phase of the periodic variations of the intensity is determined, and during selection, amplitude information of the variations is determined, preferably after filtering out variations that do not match variations due to relative movement of the alignment structure. This operation is done with a detector, which may be implemented as a suitably programmable computer that processes the same type of intensity information that is also used for phase measurement, but specialized detection hardware may be used as well. Subsequently, the alignment is performed at a position at or near a maximum of the measure of the amplitude.

Although it may be desired is that radiation reflected from the alignment structure on the substrate is imaged onto the reference structure, radiation transmitted through the reference structure being detected, it should be understood that the invention as claimed is not limited to this embodiment. Instead of transmission though the reference structure, reflection from the reference structure may be used and instead of imaging radiation from the alignment structure onto the reference structure, one may use imaging the other way around from the reference structure onto the alignment structure on the substrate.

In some embodiments of the invention, the amplitude of the variations as a function of position of the substrate is filtered with a filter that is selective for variations in the amplitude that correspond to the spatial frequency of the period of the alignment pattern and the filtered amplitudes are use in the search. One way of implementing such filtering is to correlate the amplitude variations with a plurality of mutually displaced versions of a basic matching pattern. Correlation techniques are also often used to determine the phase, but in that case a single displaced version may suffice. By using correlation techniques, circuitry of a type that is used to determine the phase may also be used to determine the amplitude information.

It may be desirable to use a phase grating alignment technique for alignment, wherein only selected orders of diffraction from the alignment structure are used to determine the amplitudes.

In some embodiments of the invention, the phase of the intensity variation of the measurement light is used for alignment in one direction, typically the direction in which the periods of the alignment structure follow one another. In such case, further alignment structures on the substrate and/or reference structures in the lithographic apparatus may be used to control alignment in another direction transverse to said direction. Nevertheless, a single alignment structure and/or reference structure may be used for the two-dimensional search for a position of the substrate for the preposition prior to control dependent on the phase. Such an arrangement is possible because the amplitude of the intensity variations of the output radiation may be indicative of overlap in two dimensions even when the phase is indicative of position in only one dimension.

In some embodiments of the invention, only a single direction component in a direction transverse to the direction of periodic variation of the periodic alignment structure is determined from the amplitude measurements for an alignment structure. This approach may be done in cases where the image of the alignment structures extends further in the direction of the periodic variation than transverse to that direction. This effect may be a result of the fact that alignment structures are provided in scribe-lanes on the wafers between adjacent chips. A large number of repetitions in an alignment structure may be realized along the length direction of a scribe-lane. Transverse to that direction, the alignment structure has a much narrower extent. This arrangement may lead to a better defined localization of the alignment structure as a function of position along said transverse direction than along the length direction of the scribe lanes. A similar effect may be caused by the way the alignment structure is imaged onto the reference structure, for example by the shape of pupil apertures used to filter light from selected order of diffraction. Therefore, in such an embodiment it may be desirable to use the maximum only to search for the component of the alignment position along a direction transverse to the direction of periodic variation of the alignment structure.

Different alignment structures, with different directions of periodic variation, may be present in mutually orthogonal scribe lanes areas on a wafer. In some embodiments of the invention, the amplitudes obtained from alignment structures with periodic variations in first and second mutually transverse directions in different scribe lanes are used to search for different components of the alignment position transverse to the first and second direction respectively. For example, alignment structures in horizontal scribe lanes may be used for searching for the vertical component of the alignment position and alignment structures in vertical scribe lanes may be used for searching for the horizontal component of the alignment position. Because an alignment structure may extend over a large range along the length of the scribe-lane, the initial position along this length is usually not critical during the search to ensure that the alignment structure is encountered when the apparatus scans transverse to this length direction.

In a device manufacturing method according to an embodiment of the invention, the alignment structure comprises a non-periodic feature which is detectable as a capture position using the alignment subsystem. Device manufacturing methods according to this and further embodiments of the invention may provide advantages which correspond to the advantages mentioned above in relation to the associated apparatus and/or methods according to embodiments of the invention.

An alignment structure according to an embodiment of the invention comprises a non-periodic feature.

A lithographic apparatus according to an embodiment of the invention may comprise a support structure for supporting patterning structure, the patterning structure serving to pattern a projection beam of radiation according to a desired pattern; a substrate table for holding a substrate with an alignment structure thereon, the alignment structure having spatially periodic optical properties; and an alignment subsystem for aligning the substrate on the substrate table relative to the patterning structure, the alignment subsystem comprising optics (e.g. an optical arrangement) for optically processing light reflected from or transmitted by the alignment structure, to produce measurement light whose intensity varies with the relative position of the spatially periodic alignment structure and a reference position defined relative to the patterning structure; with a sensor connected to the optical interference arrangement for measuring intensity and/or phase information of the measurement light, and an actuator for controlling a relative position of the substrate table and the patterning structure based on the intensity and/or phase information of the measurement light.

A device manufacturing method according to a further embodiment of the invention comprises providing a substrate that is at least partially covered by a layer of radiation-sensitive material, the substrate comprising an alignment structure with spatially varying optical properties; using patterning structure to endow a projection beam of radiation with a pattern in its cross-section; aligning the substrate relative to the patterning structure, said aligning comprising incorporating the substrate in an optical arrangement, which optically processes light reflected from or transmitted by the alignment structure, to produce measurement light of which the intensity varies with the relative position of the spatially periodic alignment structure and a reference position defined relative to the patterning structure; measuring intensity and/or phase information of the measurement light; controlling a relative position of the substrate and the patterning structure based on the intensity and/or phase information; and projecting the patterned beam of radiation onto a target portion of the layer of radiation-sensitive material.

An alignment structure according to an embodiment of the invention for aligning a work piece relative to a reference position using optical measurements, such as interferometric measurements, comprises at least one phase grating mark having a plurality of adjacent lines and spaces with a predetermined periodicity.

Whilst specific embodiments of the invention have been described above, it will be appreciated that the invention as claimed may be practiced otherwise than as described. It is explicitly noted that the description of these embodiments is not intended to limit the invention as claimed.

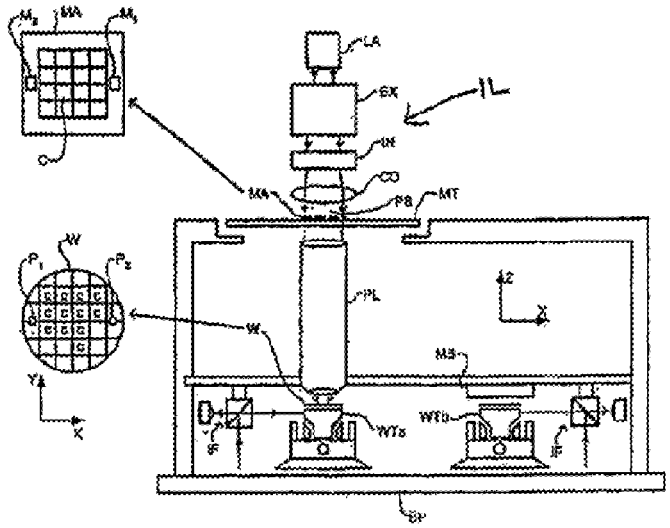

The invention claimed is:

1. An alignment structure comprising at least one phase grating mark having a plurality of adjacent lines and spaces with a predetermined periodicity,
wherein the alignment structure comprises a non-periodic feature located between two parts of the alignment structure that have predetermined periodicities along a line and wherein the non-periodic feature comprises a transition from a first part of the alignment structure having a first periodicity to a second part of the alignment structure having a second periodicity.

2. The alignment structure according to claim 1, in which the non-periodic feature includes a change of the width of one of the lines or spaces of the alignment structure between the two parts of the alignment structure.

3. The alignment structure according to claim 1, wherein the first periodicity is less than the second periodicity.

4. The alignment structure according to claim 3, wherein the first periodicity is less than the periodicity of a reference grating, and wherein the second periodicity is greater than the periodicity of the reference grating.

5. The alignment structure according to claim 1, wherein the alignment structure comprises a position-dependent period change expressible as $$\Delta(x) = \frac{\cos\left(\frac{2\pi}{L}x\right) - 1}{x}$$

in which $\Delta(x)$ denotes the position-dependent period change, x denotes a position along the alignment structure, and L denotes a length of the alignment structure over which the phase varies.

6. The alignment structure according to claim 1, in which the non-periodic feature includes a transition from a first part of the alignment structure to a second part of the alignment structure, the first part having a periodicity of X microns and the second part having a periodicity of X/n microns, X being a positive nonzero number and n being a positive nonzero integer.

7. The alignment structure according to claim 1, in which the non-periodic feature includes a the transition from a first part of the alignment structure to a second part of the alignment structure, the first part having a first duty cycle value of the lines and spaces and the second part having a second duty cycle value of the lines and spaces different than the first duty cycle value.

8. A substrate including an alignment structure comprising at least one phase grating mark having a plurality of adjacent lines and spaces with a predetermined periodicity,
wherein the alignment structure comprises a non-periodic feature located between two parts of the alignment structure that have predetermined periodicities along a line and wherein the non-periodic feature comprises a transition from a first part of the alignment structure having a first periodicity to a second part of the alignment structure having a second periodicity.

* * * * *

UNITED STATES PATENT AND TRADEMARK OFFICE
CERTIFICATE OF CORRECTION

PATENT NO. : 6,995,831 B2
APPLICATION NO. : 11/068895
DATED : February 7, 2006
INVENTOR(S) : Leon Martin Lev Asier It is certified that error appears in the above-identified patent and that said Letters Patent is hereby corrected as shown below:

The title page should be deleted and substitute therefore the attached title page.

Column 12, line 61
  replace "than" with --then--

Column 13, line 10
  replace "1% o" with --1%--

Column 13, line 51
  replace "a" with --$\alpha$--

Column 18, line 26
  replace "possibl" with --possible--

Column 21, line 14
  replace "a" with --an--

Column 22, line 5
  replace "a" with --an--

Column 22, line 49
  replace "anfse" with --arise--

Column 23, line 60
  replace "a" with --$\alpha$--

Column 25, line 22
  delete "is"

UNITED STATES PATENT AND TRADEMARK OFFICE
CERTIFICATE OF CORRECTION

PATENT NO. : 6,995,831 B2
APPLICATION NO. : 11/068895
DATED : February 7, 2006
INVENTOR(S) : Leon Martin Lev Asier It is certified that error appears in the above-identified patent and that said Letters Patent is hereby corrected as shown below:

Column 25, line 27
   replace "though" with --through--

Signed and Sealed this

Thirteenth Day of March, 2007

JON W. DUDAS
*Director of the United States Patent and Trademark Office*

(12) United States Patent
Levasier et al.

(10) Patent No.: US 6,995,831 B2
(45) Date of Patent: Feb. 7, 2006

(54) LITHOGRAPHIC APPARATUS WITH ALIGNMENT SUBSYSTEM, DEVICE MANUFACTURING METHOD, USING ALIGNMENT, AND ALIGNMENT STRUCTURE

(75) Inventors: Leon Martin Levasier, Hedel (NL); Arie Jeffrey Den Boef, Waalre (NL); Ingo Dirnstorfer, Eindhoven (NL); Andre Bernardus Jeunink, Bergeyk (NL); Stefan Geerte Kruijswijk, Eindhoven (NL); Henricus Petrus Maria Pellemans, Veldhoven (NL); Irwan Dani Setija, Utrecht (NL); Holte Pieter Theodoor Tolsma, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 11/068,895

(22) Filed: Mar. 2, 2005

(65) Prior Publication Data
US 2005/0146699 A1 Jul. 7, 2005

Related U.S. Application Data

(62) Division of application No. 10/736,230, filed on Dec. 16, 2003.

(30) Foreign Application Priority Data

| Dec. 16, 2002 | (EP) | ............................ 02080334 |
| Feb. 14, 2003 | (EP) | ............................ 03075432 |
| Apr. 4, 2003 | (EP) | ............................ 03076010 |

(51) Int. Cl.
G03B 27/42 (2006.01)
G03F 1/00 (2006.01)
G03F 9/00 (2006.01)

(52) U.S. Cl. .................. 355/53; 430/5; 430/22
(58) Field of Classification Search .......... 355/52, 355/53, 55, 67; 430/5, 20, 30; 356/399–401; 250/548
See application file for complete search history.

(56) References Cited

U.S. PATENT DOCUMENTS

| 5,025,166 A | 6/1991 | van der Werf |
| 5,477,057 A | 12/1995 | Angeley et al. |
| 5,754,300 A | 5/1998 | Magome et al. |
| 6,011,611 A * | 1/2000 | Nomura et al. ............. 355/67 |

(Continued)

FOREIGN PATENT DOCUMENTS

EP 0 477 026 B1 4/1995

(Continued)

OTHER PUBLICATIONS

European Search Report dated Oct. 22, 2003 in reference to European Application No. 02 08 0334.

(Continued)

*Primary Examiner*—Henry Hung Nguyen
(74) *Attorney, Agent, or Firm*—Pillsbury Winthrop Shaw Pittman LLP

(57) ABSTRACT

A lithographic apparatus according to one embodiment of the invention includes an alignment subsystem configured to align the substrate on the substrate table relative to the patterning structure. The alignment structure comprises a non-periodic feature which may be detectable as e.g. a capture position or a check position using a reference grating in the alignment subsystem. The non-periodic feature may cause a phase effect in the detected signal of the alignment subsystem or an amplitude effect.

8 Claims, 8 Drawing Sheets